United States Patent
Okabe et al.

(10) Patent No.: US 10,892,720 B2
(45) Date of Patent: Jan. 12, 2021

(54) CONTROL CIRCUIT FOR POWER AMPLIFIER

(71) Applicant: Murata Manufacturing Co., Ltd., Kyoto (JP)

(72) Inventors: Takeyuki Okabe, Kyoto (JP); Fuminori Morisawa, Kyoto (JP); Mizuho Ishikawa, Kyoto (JP); Yuri Honda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 43 days.

(21) Appl. No.: 16/364,324

(22) Filed: Mar. 26, 2019

(65) Prior Publication Data

US 2019/0326865 A1 Oct. 24, 2019

(30) Foreign Application Priority Data

Apr. 19, 2018 (JP) ................................ 2018-080864

(51) Int. Cl.
| | | |
|---|---|---|
| H03F 3/04 | (2006.01) | |
| H03F 3/21 | (2006.01) | |
| H03F 1/02 | (2006.01) | |
| H03F 3/213 | (2006.01) | |
| H03F 1/30 | (2006.01) | |

(52) U.S. Cl.
CPC ............ *H03F 3/211* (2013.01); *H03F 1/0216* (2013.01); *H03F 3/213* (2013.01); *H03F 1/302* (2013.01); *H03F 3/04* (2013.01); *H03F 2200/451* (2013.01); *H03F 2200/468* (2013.01); *H03F 2203/21127* (2013.01)

(58) Field of Classification Search
CPC ........ H03F 3/211; H03F 1/0216; H03F 3/213; H03F 2203/21127; H03F 2200/468; H03F 1/302; H03F 2200/451; H03F 3/19; H03F 3/21; H03F 2200/18; H03F 1/301; H03F 1/0261; H03G 3/3036; H03G 3/3042; H03G 3/3047
USPC ...................................... 330/285, 296
See application file for complete search history.

(56) References Cited

U.S. PATENT DOCUMENTS

| | | | | |
|---|---|---|---|---|
| 7,639,080 B2 * | 12/2009 | Nakayama | ............... | H03F 3/189 330/133 |
| 8,686,795 B2 * | 4/2014 | Okamura | ............... | H03F 1/0261 330/285 |
| 8,692,619 B2 * | 4/2014 | Wakita | .................. | H03F 1/0261 330/289 |
| 8,917,144 B2 * | 12/2014 | Iyomasa | ............... | H03F 1/0261 330/124 R |
| 9,407,207 B2 * | 8/2016 | Tsutsui | ..................... | H03F 3/21 |
| 9,768,738 B2 * | 9/2017 | Honda | ...................... | H03F 3/21 |

(Continued)

FOREIGN PATENT DOCUMENTS

JP 2017-22685 A 1/2017

*Primary Examiner* — Khanh V Nguyen
(74) *Attorney, Agent, or Firm* — Pearne & Gordon LLP

(57) ABSTRACT

A control circuit includes a first output unit configured to output a constant bias current for setting an electrical bias state of a bias circuit to the bias circuit; a second output unit configured to output a bias control current or constant voltage for controlling the electrical bias state of the bias circuit to the bias circuit; a resistor having one end connected to a reference potential; and a switch provided between another end of the resistor and an output terminal of the second output unit.

20 Claims, 9 Drawing Sheets

(56) References Cited

U.S. PATENT DOCUMENTS 10,547,307 B2 * 1/2020 Won .................. H03K 17/60
2018/0294788 A1 10/2018 Ishihara et al.

* cited by examiner

FIG. 10

| OPERATION MODE \ SWITCH | SW$_1$ | SW$_2$ | SW$_3$ | OUTPUT |
|---|---|---|---|---|
| FIRST OPERATION MODE | OFF | ON | OFF | VARIABLE CURRENT I$_{ec}$ |
| SECOND OPERATION MODE | ON | OFF | ON | CONSTANT VOLTAGE V$_{bat}$ |

CONTROL CIRCUIT FOR POWER AMPLIFIER

This application claims priority from Japanese Patent Application No. JP2018-080864 filed on Apr. 19, 2018. The content of this application is incorporated herein by reference in its entirety.

BACKGROUND OF THE DISCLOSURE

1. Field of the Disclosure

The present disclosure relates to a control circuit that controls a power amplifier.

2. Description of the Related Art

In Global System for Mobile Communications (GSM) (registered trademark), which is the second generation mobile communication system, Gaussian minimum shift keying (GMSK), Enhanced Data Rates for GSM Evolution (EDGE), and so forth are used as modulation schemes. The GMSK is used specifically for voice communications, and the EDGE is used specifically for packet data communications.

A wireless communication device, such as a smartphone, includes a power amplifier that amplifies a radio frequency input signal and outputs a radio frequency output signal. In the GMSK, the power of a radio frequency output signal is controlled by supplying a bias current corresponding to a level control voltage to a bias circuit. In the EDGE, the power of a radio frequency output signal is controlled by controlling the power of a radio frequency input signal.

Japanese Unexamined Patent Application Publication No. 2017-22685 discloses a power amplification module that has a first operation mode in which a bias current is controlled in accordance with a level control voltage and a second operation mode in which the bias current is not controlled in accordance with the level control voltage.

It is desired that a power amplifier is preferably controlled both in a first operation mode in which a bias current is controlled in a variable manner in accordance with a level control voltage and in a second operation mode in which the bias current is not controlled in a variable manner in accordance with the level control voltage.

BRIEF SUMMARY OF THE DISCLOSURE

In view of the above, the present disclosure has been made to make it possible to preferably control a power amplifier.

A control circuit for a power amplifier according to one preferred embodiment of the present disclosure is a control circuit that controls the power amplifier including one or multiple stages of power amplifier circuits, and one or multiple bias circuits configured to set electrical bias states of the one or multiple stages of power amplifier circuits. The control circuit includes a first output unit configured to output a constant bias current for setting electrical bias states of the one or multiple bias circuits to the one or multiple bias circuits; a second output unit configured to output a bias control current or constant voltage for controlling the electrical bias states of the one or multiple bias circuits to the one or multiple bias circuits; a resistor having one end connected to a reference potential; and a switch provided between another end of the resistor and an output terminal of the second output unit.

The preferred embodiment of the present disclosure can provide good output characteristics.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 10 illustrates a relationship between an operation mode and a switch in the embodiment.

DETAILED DESCRIPTION OF THE DISCLOSURE

An embodiment of a control circuit for a power amplifier according to the present disclosure will be described in detail below with reference to the drawings. Note that the present disclosure is not to be limited by the embodiment. Each embodiment is merely illustrative, and it goes without saying that configurations described in different embodiments can be partially replaced or combined.

Principle of Embodiment

First, comparative examples will be described to facilitate understanding of a principle of the embodiment.

First Comparative Example

Figure 1:
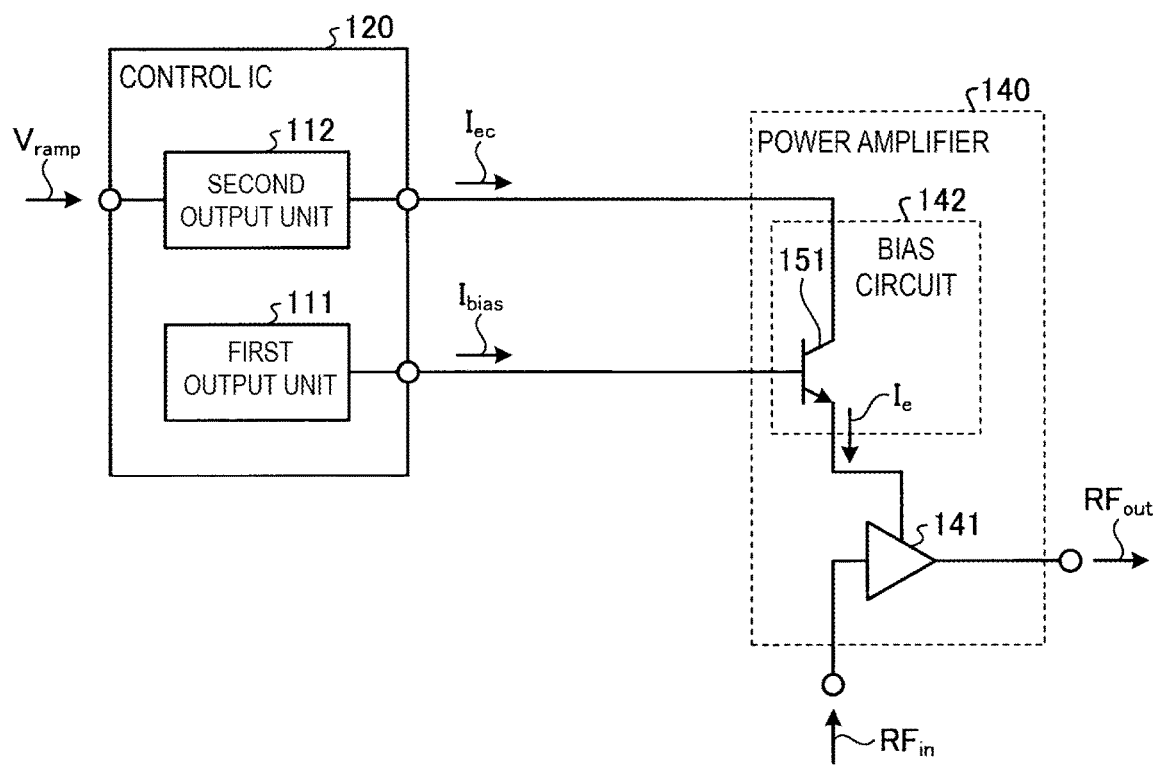
FIG. 1 illustrates a first comparative example.

FIG. 1 illustrates a first comparative example. A control integrated circuit (IC) 120, which is a semiconductor integrated circuit, controls a power amplifier 140.

The power amplifier 140 includes a power amplifier circuit 141 that amplifies a high-frequency input signal $RF_{in}$ of a radio frequency and outputs a high-frequency output signal $RF_{out}$, and a bias circuit 142 that sets an electrical bias state of the power amplifier circuit 141.

The bias circuit 142 includes a transistor 151. In the first comparative example, although the transistor 151 is a heterojunction bipolar transistor (HBT), the transistor 151 is not limited to this. For example, the transistor 151 may be a field-effect transistor (FET).

In the first comparative example, although the power amplifier 140 includes a one-stage power amplifier circuit, the number of power amplifier circuit stages included in the power amplifier 140 is not limited to one. The power amplifier 140 may include multiple stages of power amplifier circuits.

A constant bias current $I_{bias}$ is supplied from the control IC 120 to a base of the transistor 151. A bias control current $I_{ec}$ for controlling an electrical bias state of the transistor 151 is supplied from the control IC 120 to a collector of the transistor 151. The transistor 151 outputs an emitter current (bias current $I_e$) corresponding to the bias current $I_{bias}$ and the bias control current $I_{ec}$ to the power amplifier circuit 141.

The electrical bias state of the power amplifier circuit 141 is set by the bias current $I_e$, and the gain of the power amplifier circuit 141 is set.

The control IC 120 has a first operation mode in which the bias control current $I_{ec}$ is controlled in a variable manner in accordance with a level control voltage $V_{ramp}$ and a second operation mode in which the bias control current $I_{ec}$ is not controlled in a variable manner. Although, as an example, the case where the control IC 120 operates in the first operation mode when a modulation scheme is Gaussian minimum shift keying (GMSK) is described, the present disclosure is not limited to this. Although, as an example, the case where the control IC 120 operates in the second operation mode when a modulation scheme is Enhanced Data Rates for GSM Evolution (EDGE) is described, the present disclosure is not limited to this.

The control IC 120 includes a first output unit 111, and a second output unit 112. The first output unit 111 outputs the constant bias current $I_{bias}$ to the base of the transistor 151. The first output unit 111 may be a constant current source, or may be a constant voltage source. Furthermore, the first output unit 111 may be a variable current source or a variable voltage source.

In the second operation mode, the second output unit 112 outputs the bias control current $I_{ec}$ that is constant to the collector of the transistor 151. At this time, the second output unit 112 may operate as a constant current source, or may operate as a constant voltage source.

The emitter current (bias current $I_e$) of the transistor 151 is the sum of the bias current $I_{bias}$, which is a base current, and the bias control current $I_{ec}$, which is a collector current. Thus, in the second operation mode, since the bias control current $I_{ec}$ is constant, the emitter current (bias current $I_e$) is also constant. That is, in the second operation mode, the gain of the power amplifier circuit 141 is maintained constant. Thus, in the second operation mode, the power of the high-frequency output signal $RF_{out}$ is controlled by controlling the power of the high-frequency input signal $RF_{in}$.

In the first operation mode, the second output unit 112 outputs the bias control current $I_{ec}$ corresponding to the level control voltage $V_{ramp}$ to the collector of the transistor 151. At this time, the second output unit 112 preferably operates as a current source.

In the first operation mode, since the bias control current $I_{ec}$ is variable in accordance with the level control voltage $V_{ramp}$, the bias current $I_e$ is also variable in accordance with the level control voltage $V_{ramp}$. Then, the gain of the power amplifier circuit 141 is controlled by the bias current $I_e$. That is, in the first operation mode, the gain of the power amplifier circuit 141 is controlled to be a gain corresponding to the level control voltage $V_{ramp}$.

In the first comparative example, when the level control voltage $V_{ramp}$ is very low in the first operation mode, there is the following issue.

The second output unit 112 outputs, in accordance with the level control voltage $V_{ramp}$, the bias control current $I_{ec}$ that is very small. The very small bias control current $I_{ec}$ is on the order of about several microamperes (μA), for example. On the other hand, the bias current $I_{bias}$ is constant. The bias current $I_{bias}$ is on the order of about several tens of microamperes, for example.

The emitter current (bias current $I_e$) of the transistor 151 is the sum of the bias current $I_{bias}$, which is the base current, and the bias control current $I_{ec}$, which is the collector current. Thus, even when the bias control current $I_{ec}$ is controlled to be on the order of about several microamperes, since the constant bias current $I_{bias}$ is on the order of about several tens of microamperes, the emitter current (bias current $I_e$) is substantially equal to the bias current $I_{bias}$ and reaches a value on the order of about several tens of microamperes.

That is, even when the control IC 120 controls the bias control current $I_{ec}$ to a very small value in accordance with the level control voltage $V_{ramp}$, the control IC 120 is not able to make the bias current $I_e$ smaller than the bias current $I_{bias}$. Thus, when the level control voltage $V_{ramp}$ is very low, the control IC 120 is not able to preferably control the gain of the power amplifier 140 to a gain corresponding to the level control voltage $V_{ramp}$.

Second Comparative Example

Figure 2:
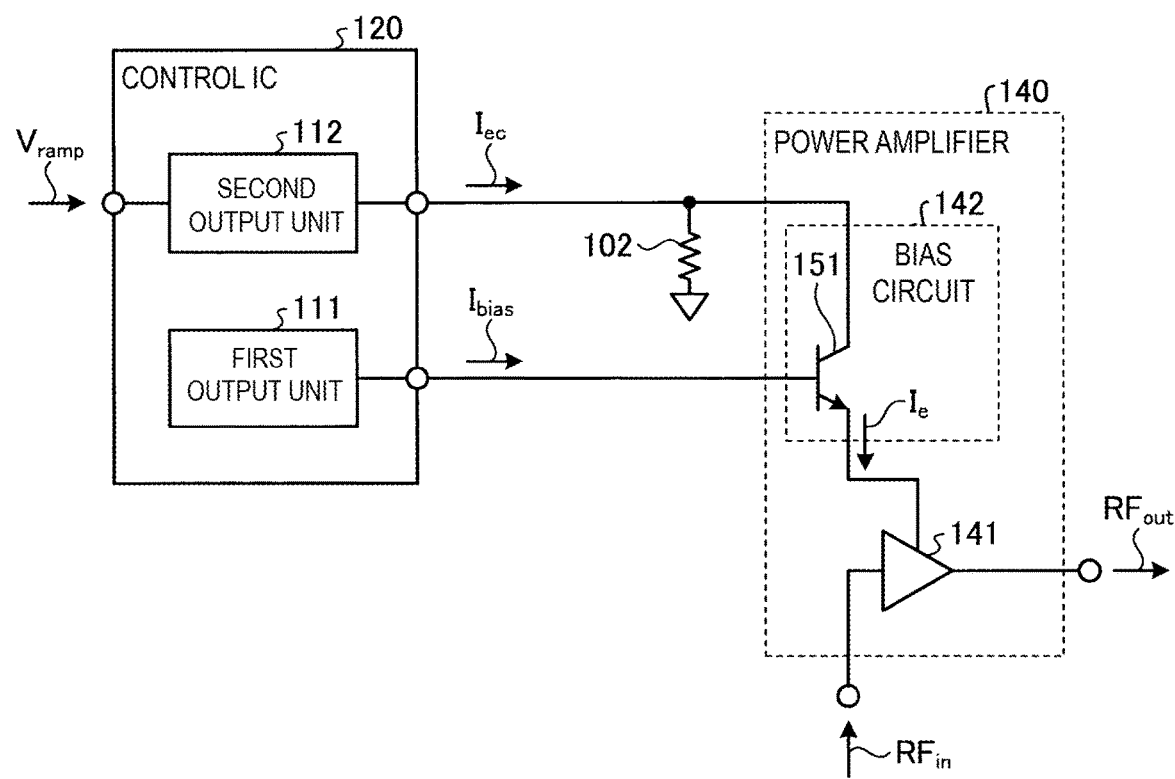
FIG. 2 illustrates a second comparative example.

FIG. 2 illustrates a second comparative example. Components that are the same as those in the first comparative example are denoted by the same reference numerals, and the descriptions thereof are omitted.

In the second comparative example, a resistor 102 is provided between a line connecting the second output unit 112 to the collector of the transistor 151 and a reference potential. Although the reference potential is, for example, a ground potential, the reference potential is not limited to this.

In the first operation mode, the second output unit 112 outputs the bias control current $I_{ec}$ corresponding to the level control voltage $V_{ramp}$ to the collector of the transistor 151.

The case where the level control voltage $V_{ramp}$ is very low in the first operation mode will be described.

The second output unit 112 outputs, in accordance with the level control voltage $V_{ramp}$, the bias control current $I_{ec}$ that is very small (for example, on the order of about several microamperes (μA)). On the other hand, the bias current $I_{bias}$ is constant (for example, on the order of about several tens of microamperes).

Thus, when the bias current $I_{bias}$ is much larger than the bias control current $I_{ec}$, a parasitic diode between the base and the collector of the transistor 151 is turned on, and a part of the bias current $I_{bias}$ flows from a collector end of the transistor 151 to the resistor 102. The remaining part of the bias current $I_{bias}$ flows, as the emitter current (bias current $I_e$), from the emitter of the transistor 151 to the power amplifier circuit 141.

That is, when the control IC 120 controls the bias control current $I_{ec}$ to a very small value in accordance with the level control voltage $V_{ramp}$, the control IC 120 can make the bias current $I_e$ much smaller.

Thus, in the second comparative example, even when the level control voltage $V_{ramp}$ is very low in the first operation mode, the gain of the power amplifier circuit 141 can preferably be controlled in comparison with the first comparative example.

Note that, in the second comparative example, in the second operation mode, there is the following issue.

In the second operation mode, the second output unit 112 outputs the bias control current $I_{ec}$ that is constant. A part of the bias control current $I_{ec}$ flows, as a shunt current, to the reference potential through the resistor 102. At the same time, the remaining part of the bias control current $I_{ec}$ flows to the collector of the transistor 151.

That is, in the second comparative example, in the second operation mode, an unnecessary shunt current flows at all times, which increases power consumption.

Principle of Embodiment

Figure 3:
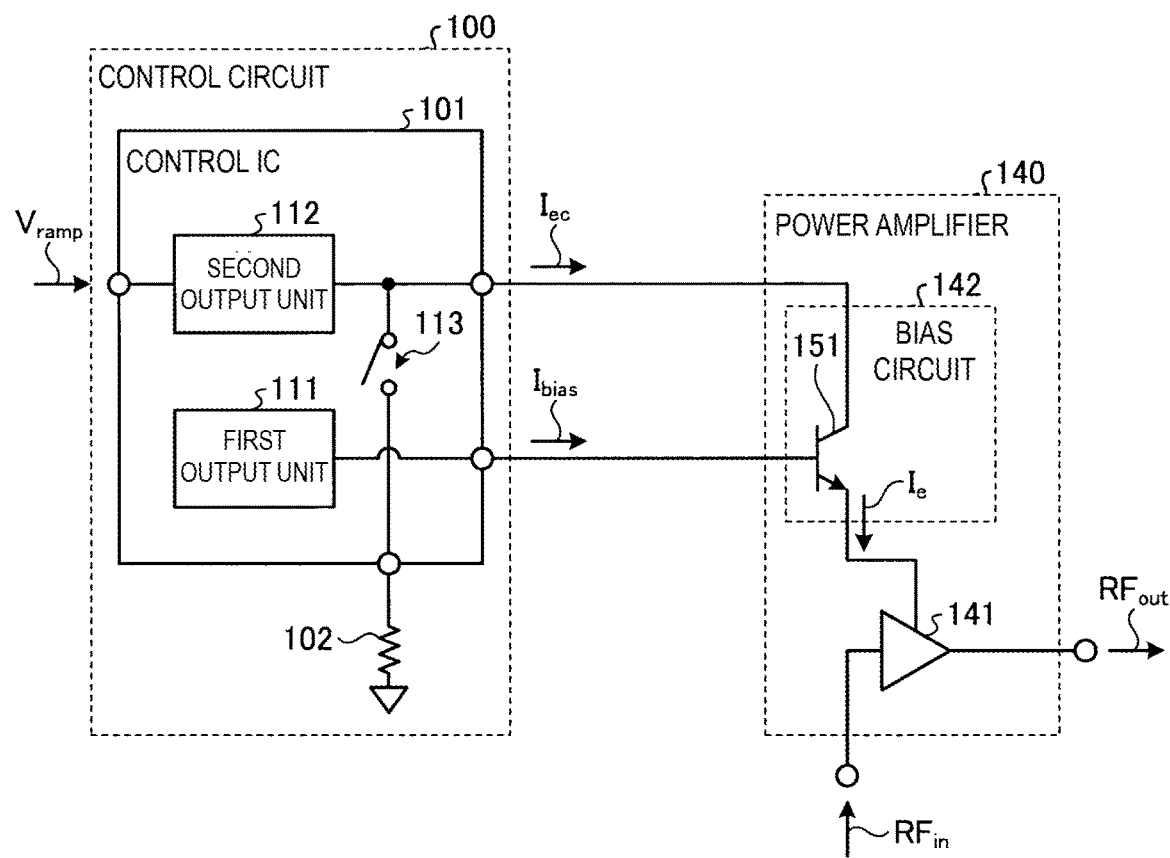
FIG. 3 illustrates a principle of an embodiment.

FIG. 3 illustrates a principle of the embodiment.

Components that are the same as those in the comparative examples are denoted by the same reference numerals, and the descriptions thereof are omitted.

A control circuit 100 controls the power amplifier 140. The control circuit 100 includes a control IC 101 and the resistor 102. The control IC 101 further includes a switch 113 in addition to the first output unit 111 and the second output unit 112.

In the embodiment, although the resistor 102 is provided outside the control IC 101, the place where the resistor 102 is provided is not limited to this. The resistor 102 may be provided within the control IC 101. The case where the resistor 102 is provided outside the control IC 101 facilitates changing a resistance value of the resistor 102 according to a product in which the control circuit 100 is installed. Furthermore, variations in the resistance value of the resistor 102 can be reduced. The case where the resistor 102 is provided within the control IC 101 can reduce the number of components and reduce a footprint.

Although the resistance value of the resistor 102 ranges from about 100 ohms (Ω) to about 200 ohms (Ω), for example, the resistance value is not limited to this.

In the embodiment, although the switch 113 is provided within the control IC 101, the place where the switch 113 is provided is not limited to this. The switch 113 may be provided outside the control IC 101. The case where the switch 113 is provided within the control IC 101 can reduce the number of components and reduce a footprint.

A resistance value of on-resistance of the switch 113 is preferably not greater than about 10 percent (%) of, and more preferably not greater than about 5 percent (%) of the resistance value of the resistor 102. Although the resistance value of on-resistance of the switch 113 is not greater than about 10 ohms (Ω), and preferably not greater than about 4 ohms (Ω), for example, the resistance value of on-resistance of the switch 113 is not limited to this. Although the switch 113 is, for example, an FET, the switch 113 is not limited to this.

One end of the resistor 102 is connected to the reference potential. The switch 113 is electrically connected between the other end of the resistor 102 and an output terminal of the second output unit 112.

The switch 113 is put into an on state when a first operation mode logic control signal is outputted from a digital logic circuit (to be described) within the control IC 101, thereby providing continuity between the other end of the resistor 102 and the output terminal of the second output unit 112. Hereinafter, a control signal from the digital logic circuit is referred to as "operation mode control signal".

The switch 113 is put into an off state when a second operation mode logic control signal is outputted from the digital logic circuit, thereby interrupting continuity between the other end of the resistor 102 and the output terminal of the second output unit 112.

As an operation mode control signal, first operation mode logic data is outputted during the first operation mode, and second operation mode logic data is outputted during the second operation mode.

Hence, the switch 113 provides continuity between the other end of the resistor 102 and the output terminal of the second output unit 112 in the first operation mode. Furthermore, the switch 113 interrupts continuity between the other end of the resistor 102 and the output terminal of the second output unit 112 in the second operation mode.

The operation of the control circuit 100 in the first operation mode is the same as that in the first operation mode in the second comparative example, and the description thereof is omitted.

That is, when the control circuit 100 controls the bias control current $I_{ec}$ to a very small value in accordance with the level control voltage $V_{ramp}$ in the first operation mode, the control circuit 100 can make the bias current $I_e$ much smaller.

Thus, even when the level control voltage $V_{ramp}$ is very low in the first operation mode, the control circuit 100 can preferably control the gain of the power amplifier circuit 141 in comparison with the first comparative example.

In the embodiment, the resistance value of on-resistance of the switch 113 is preferably not greater than about 10 percent (%) of, and more preferably not greater than about 5 percent (%) of the resistance value of the resistor 102. That is, a relationship of (resistance value of on-resistance of switch 113)<<(resistance value of resistor 102) is preferable. Thus, the control circuit 100 can reduce variations in a shunt current that flows to the reference potential through the resistor 102.

In the first operation mode of the control circuit 100, a current value of the shunt current that flows to the reference potential through the resistor 102 is constant regardless of a current value of the bias control current $I_{ec}$.

The operation of the control circuit 100 in the second operation mode is the same as that in the second operation mode in the first comparative example, and the description thereof is omitted.

That is, an unnecessary shunt current does not flow in the second operation mode, and the control circuit 100 can therefore reduce power consumption.

Figure 4:
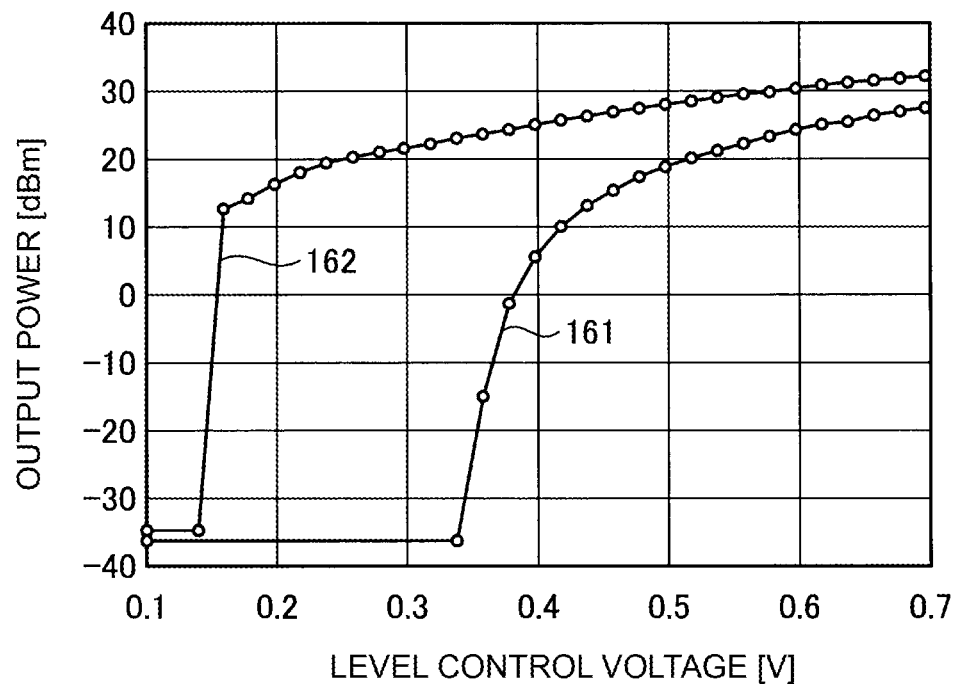
FIG. 4 illustrates a relationship between a level control voltage and output power in the embodiment.

FIG. 4 illustrates a relationship between a level control voltage and output power in the embodiment. A waveform 161 represents, in the first operation mode of the control circuit 100, a relationship between the level control voltage $V_{ramp}$ and the power of the high-frequency output signal $RF_{out}$. A waveform 162 represents, in the first operation mode in the first comparative example, a relationship between the level control voltage $V_{ramp}$ and the power of the high-frequency output signal $RF_{out}$.

As indicated by the waveform 162, in the first comparative example, the high-frequency output signal $RF_{out}$ is not able to be preferably controlled in a region where output power is very small (for example, not greater than about 10 dBm). In other words, the output power rises steeply for a change in the level control voltage $V_{ramp}$, and an output level is not able to be minutely adjusted.

On the other hand, as indicated by the waveform 161, the control circuit 100 can preferably control the high-frequency output signal $RF_{out}$ even in a region where output power is very small, that is, not greater than about 10 dBm. In other words, the output power changes gently for a change in the level control voltage $V_{ramp}$. Thus, in comparison with the waveform 162, the output power can be controlled by the level control voltage $V_{ramp}$ even in the region where the output power is very small, that is, not greater than about 10 dBm.

Figure 5:
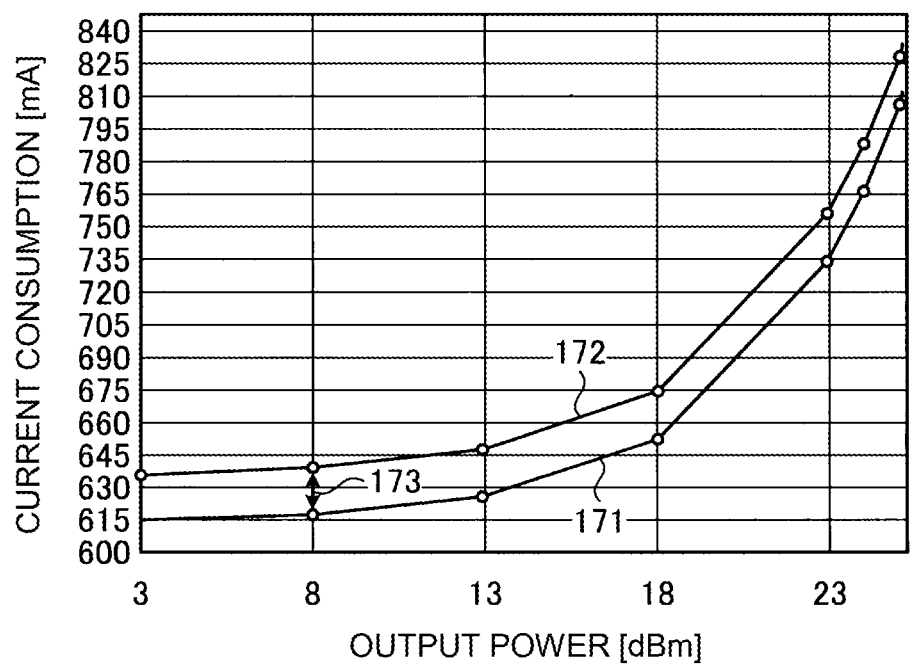
FIG. 5 illustrates a relationship between output power and current consumption in the embodiment.

FIG. 5 illustrates a relationship between output power and current consumption in the embodiment. A waveform 171 represents, in the second operation mode of the control circuit 100, a relationship between the power of the high-frequency output signal $RF_{out}$ and current consumption. A waveform 172 represents, in the second operation mode in the second comparative example, a relationship between the power of the high-frequency output signal $RF_{out}$ and current consumption.

When the waveform 171 and the waveform 172 are compared, the control circuit 100 can reduce current consumption in comparison with the second comparative example. A difference 173 between the current consumption of the control circuit 100 and the current consumption of the control IC 120 in the second comparative example is represented by (output voltage of second output unit 112)÷(resistance value of resistor 102).

Embodiment

An example of a specific configuration of the embodiment will be described.

Figure 6:
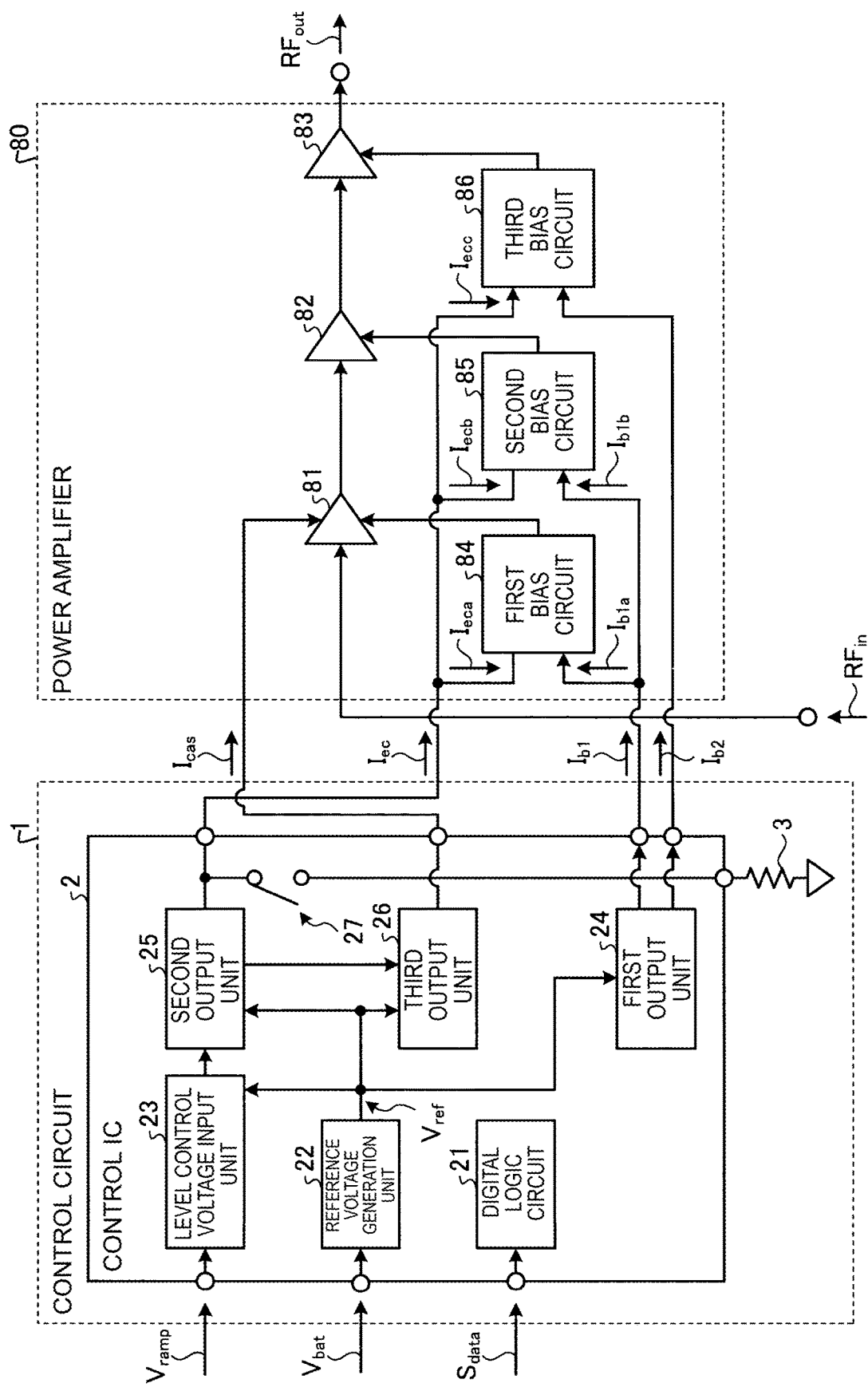
FIG. 6 illustrates an overall configuration of the embodiment.

FIG. 6 illustrates an overall configuration of the embodiment. A control circuit 1 controls a power amplifier 80.

The power amplifier 80 includes a first power amplifier circuit 81, a second power amplifier circuit 82, a third power amplifier circuit 83, a first bias circuit 84, a second bias circuit 85, and a third bias circuit 86.

In the embodiment, although the power amplifier 80 includes three stages of power amplifier circuits, the number of power amplifier circuit stages included in the power amplifier 80 is not limited to three. The power amplifier 80 may include one, two, or four or more stages of power amplifier circuits.

The first bias circuit 84 sets an electrical bias state of the first power amplifier circuit 81. The second bias circuit 85 sets an electrical bias state of the second power amplifier circuit 82. The third bias circuit 86 sets an electrical bias state of the third power amplifier circuit 83.

The control circuit 1 includes a control IC 2 and a resistor 3. The control IC 2 includes a digital logic circuit 21, a reference voltage generation unit 22, a level control voltage input unit 23, a first output unit 24, a second output unit 25, a third output unit 26, and a switch 27.

Serial data $S_{data}$ is inputted to the digital logic circuit 21 from an external circuit, and a value is set in the digital logic circuit 21. Although the external circuit is, for example, a central processing unit (CPU), the external circuit is not limited to this. The first output unit 24, the second output unit 25, the third output unit 26, and the switch 27 operate in accordance with a value set in the digital logic circuit 21.

The reference voltage generation unit 22 generates a reference voltage $V_{ref}$ by using a reference voltage generation circuit (band-gap circuit) within the control circuit 1. The reference voltage $V_{ref}$ is outputted to the level control voltage input unit 23, the first output unit 24, the second output unit 25, and the third output unit 26. The level control voltage input unit 23, the first output unit 24, the second output unit 25, and the third output unit 26 operate by using the reference voltage $V_{ref}$.

The level control voltage input unit 23 performs, on the level control voltage $V_{ramp}$ inputted from the external circuit, limiter processing in which a reduction to an upper limit is made and filtering processing in which noise from the outside is reduced, and outputs the level control voltage $V_{ramp}$ to the second output unit 25.

The first output unit 24 outputs a constant bias current $I_{b1}$ to the first bias circuit 84 and the second bias circuit 85. The first output unit 24 may be a constant current source, or may be a constant voltage source. Furthermore, the first output unit 24 may be a variable current source or variable voltage source corresponding to a bias.

A bias current $I_{b1a}$, which is a part of the bias current $I_{b1}$, is inputted to the first bias circuit 84, and a bias current $I_{b1b}$, which is the remaining part of the bias current $I_{b1}$, is inputted to the second bias circuit 85. That is, the equation $I_{b1}=I_{b1a}+I_{b1b}$ holds.

The first output unit 24 outputs a constant bias current $I_{b2}$ to the third bias circuit 86. The first output unit 24 may be a constant current source, or may be a constant voltage source.

In the embodiment, although the first output unit 24 outputs the bias current $I_{b1}$ to the first bias circuit 84 and the second bias circuit 85, and outputs the bias current $I_{b2}$ to the third bias circuit 86, the present disclosure is not limited to this. The first output unit 24 may output one bias current to the first bias circuit 84, the second bias circuit 85, and the third bias circuit 86. Alternatively, the first output unit 24 may output three bias currents to the respective first, second, and third bias circuits 84, 85, and 86.

In the first operation mode, the second output unit 25 outputs the bias control current $I_{ec}$ corresponding to the level control voltage $V_{ramp}$ to the first bias circuit 84, the second bias circuit 85, and the third bias circuit 86. At this time, the second output unit 25 preferably operates as a current source.

In the embodiment, although the second output unit 25 outputs the bias control current $I_{ec}$ to the first bias circuit 84, the second bias circuit 85, and the third bias circuit 86, the present disclosure is not limited to this. The second output unit 25 may output three bias control currents to the respective first, second, and third bias circuits 84, 85, and 86.

In the second operation mode, the second output unit 25 outputs the bias control current $I_{ec}$ that is constant to the first bias circuit 84, the second bias circuit 85, and the third bias circuit 86. At this time, the second output unit 25 may operate as a constant current source, or may operate as a constant voltage source.

A bias control current $I_{eca}$, which is a part of the bias control current $I_{ec}$, is inputted to the first bias circuit 84, a bias control current $I_{ecb}$, which is another part of the bias control current $I_{ec}$, is inputted to the second bias circuit 85, and a bias control current $I_{ecc}$, which is the remaining part of the bias control current $I_{ec}$, is inputted to the third bias circuit 86. That is, the equation $I_{ec}=I_{eca}+I_{ecb}+I_{ecc}$ holds.

The third output unit 26 outputs a bias current $I_{cas}$ to the first power amplifier circuit 81. As described later, the first power amplifier circuit 81 is a cascode connection circuit. The first bias circuit 84 outputs the bias current $I_{b1a}$ to one transistor constituting the cascode connection circuit, and the third output unit 26 outputs the bias current $I_{cas}$ to the other transistor constituting the cascode connection circuit. The third output unit 26 outputs the bias current $I_{cas}$ corresponding to the bias control current $I_{ec}$ outputted by the second output unit 25 to the first power amplifier circuit 81.

In the case where the first power amplifier circuit 81 is not a cascode connection circuit, the third output unit 26 is unnecessary. Furthermore, in the case where the second power amplifier circuit 82 and the third power amplifier circuit 83 are each a cascode connection circuit, the third output unit 26 may output the bias current $I_{cas}$ to the first power amplifier circuit 81, the second power amplifier circuit 82, and the third power amplifier circuit 83.

One end of the resistor 3 is connected to the reference potential. Although the reference potential is, for example, a ground potential, the reference potential is not limited to this. The switch 27 is electrically connected between the other end of the resistor 3 and an output terminal of the second output unit 25.

The switch 27 is put into an on state when a first operation mode control signal is outputted from the digital logic circuit 21, thereby providing continuity between the other end of the resistor 3 and the output terminal of the second output unit 25.

The switch 27 is put into an off state when a second operation mode control signal is outputted from the digital logic circuit 21, thereby interrupting continuity between the other end of the resistor 3 and the output terminal of the second output unit 25.

The digital logic circuit 21 outputs the first operation mode control signal during the first operation mode, and outputs the second operation mode control signal during the second operation mode.

Hence, the switch 27 provides continuity between the other end of the resistor 3 and the output terminal of the second output unit 25 in the first operation mode. Furthermore, the switch 27 interrupts continuity between the other end of the resistor 3 and the output terminal of the second output unit 25 in the second operation mode.

In the embodiment, although the resistor 3 is provided outside the control IC 2, the place where the resistor 3 is provided is not limited to this. The resistor 3 may be provided within the control IC 2. The case where the resistor 3 is provided outside the control IC 2 facilitates changing a resistance value of the resistor 3 according to a product in which the control circuit 1 is installed. Furthermore, variations in the resistance value of the resistor 3 can be reduced. The case where the resistor 3 is provided within the control IC 2 can reduce the number of components and reduce a footprint.

Although the resistance value of the resistor 3 ranges from about 100 ohms ($\Omega$) to about 200 ohms ($\Omega$), for example, the resistance value is not limited to this.

In the embodiment, although the switch 27 is provided within the control IC 2, the place where the switch 27 is provided is not limited to this. The switch 27 may be provided outside the control IC 2. The case where the switch 27 is provided within the control IC 2 can reduce the number of components and reduce a footprint.

A resistance value of on-resistance of the switch 27 is preferably not greater than about 10 percent (%) of, and more preferably not greater than about 5 percent (%) of the resistance value of the resistor 3. Although the resistance value of on-resistance of the switch 27 is not greater than about 10 ohms ($\Omega$), and preferably not greater than about 4 ohms ($\Omega$), for example, the resistance value of on-resistance of the switch 27 is not limited to this. Although the switch 27 is, for example, an FET, the switch 27 is not limited to this.

In the embodiment, the resistance value of on-resistance of the switch 27 is preferably not greater than about 10 percent (%) of, and more preferably not greater than about 5 percent (%) of the resistance value of the resistor 3. That is, a relationship of (resistance value of on-resistance of switch 27)<<(resistance value of resistor 3) is preferable. Thus, the control circuit 1 can reduce variations in a shunt current that flows to the reference potential through the resistor 3.

Figure 7:
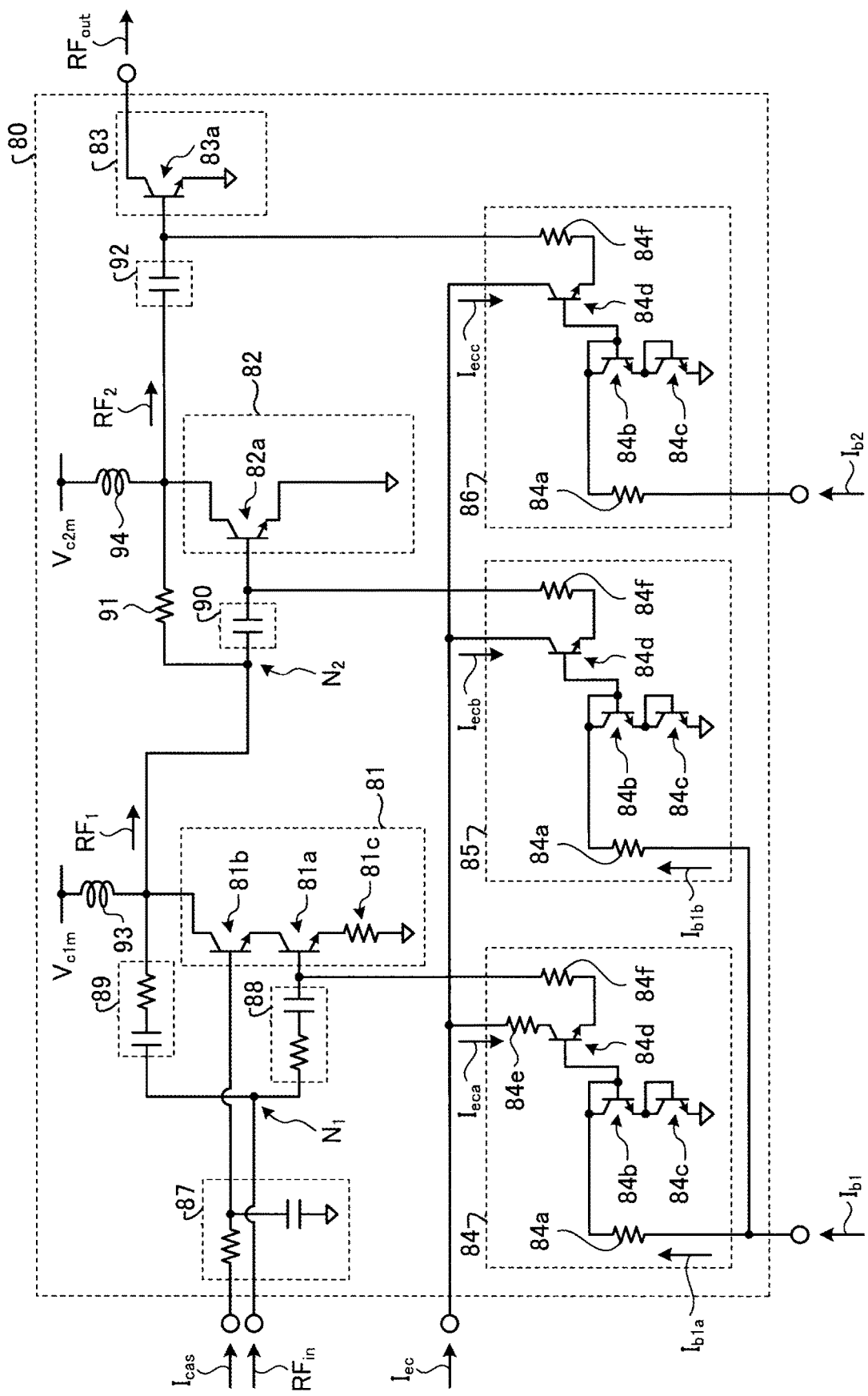
FIG. 7 illustrates a configuration of a power amplifier according to the embodiment.

FIG. 7 illustrates a configuration of a power amplifier according to the embodiment.

The first power amplifier circuit 81 includes transistors $81_a$ and $81_b$, and a resistor $81_c$.

In the embodiment, although each transistor is, for example, an HBT, the transistor is not limited to this. The transistor may be an FET, for example. Furthermore, in the embodiment, the transistor may be a multi-finger transistor including a plurality of unit transistors (also referred to as fingers) electrically connected in parallel. A unit transistor refers to a minimum component constituting the transistor.

One end of the resistor $81_c$ is connected to the reference potential. An emitter of the transistor $81_a$ is connected to the other end of the resistor $81_c$. That is, the transistor $81_a$ is an emitter follower circuit. Bias current $I_{b1a}$ is inputted to a base of the transistor $81_a$ from the first bias circuit 84. A collector of the transistor $81_a$ is connected to an emitter of the transistor $81_b$. The bias current $I_{cas}$ is inputted to a base of the transistor $81_b$ through a low pass filter 87. In the embodiment, although the low pass filter 87 is an RC circuit, the low pass filter 87 is not limited to this. The base of the transistor $81_b$ is grounded in an alternating current manner. That is, the transistor $81_b$ is a grounded-base circuit. A collector of the transistor $81_b$ is connected to a power-supply voltage $V_{c1m}$ through a choke inductor 93.

That is, the transistors $81_a$ and $81_b$ constitute a cascode connection circuit. An electrical bias state of the transistor $81_a$ is set by the bias current $I_{b1a}$ inputted from the first output unit 24 (see FIG. 6) to the first bias circuit 84, and an electrical bias state of the transistor $81_b$ is set by the bias current $I_{cas}$ inputted from the third output unit 26 (see FIG. 6).

The second power amplifier circuit 82 includes transistor $82_a$.

An emitter of the transistor $82_a$ is connected to the reference potential. That is, the transistor $82_a$ is a common-emitter circuit. Bias current $I_{b1b}$ is inputted to a base of the transistor $82_a$ from the second bias circuit 85. A collector of the transistor $82_a$ is connected to a power-supply voltage $V_{c2m}$ through a choke inductor 94. The power-supply voltage $V_{c2m}$ may be the same as or different from the power-supply voltage $V_{c1m}$.

An electrical bias state of the transistor $82_a$ is set by the bias current $I_{b1b}$ inputted from the first output unit 24 (see FIG. 6) to the second bias circuit 85.

The third power amplifier circuit 83 includes a transistor $83_a$.

An emitter of the transistor $83_a$ is connected to the reference potential. That is, the transistor $83_a$ is a common-emitter circuit. A bias current is inputted to a base of the transistor $83_a$ from the third bias circuit 86. The transistor $83_a$ outputs the high-frequency output signal $RF_{out}$ from its collector.

An electrical bias state of the transistor $83_a$ is set by the bias current $I_{b2}$ inputted from the first output unit 24 (see FIG. 6) to the third bias circuit 86.

The first bias circuit 84 includes resistors $84_a$, $84_e$, and $84_f$, and transistors $84_b$, $84_c$, and $84_d$.

The bias current $I_{b1a}$, which is a part of the bias current $I_{b1}$, is supplied to one end of the resistor $84_a$ from the first output unit 24 (see FIG. 6). A constant voltage may be supplied to the one end of the resistor $84_a$ from the first output unit 24. The bias current $I_{b1b}$, which is the remaining part of the bias current $I_{b1}$, is supplied to the second bias circuit 85.

A collector and a base of the transistor $84_b$ are connected to the other end of the resistor $84_a$. The collector and the base are connected, and thus the transistor $84_b$ is equivalent to a diode. A configuration in which a collector and a base of a transistor are connected is hereinafter referred to as "diode connected". A collector and a base of the transistor $84_c$ are connected to an emitter of the transistor $84_b$. The transistor $84_c$ is diode connected. An emitter of the transistor $84_c$ is connected to the reference potential. A collector-base potential of the transistor $84_b$ corresponds to the amount of the voltage drop across a collector-emitter path of the transistor $84_b$ and across a collector-emitter path of the transistor $84_c$. That is, the collector-base potential of the transistor $84_b$ corresponds to the voltage drop across two diodes.

A base of the transistor $84_d$ is connected to the base and the collector of the transistor $84_b$. A base current is supplied to the base of the transistor $84_d$ through the resistor $84_a$. A base potential of the transistor $84_d$ is the same as the collector-base potential of the transistor $84_b$.

A collector of the transistor $84_d$ is connected to one end of the resistor $84_e$. The bias control current $I_{eca}$, which is a part of the bias control current $I_{ec}$, is supplied to the other end of the resistor $84_e$ from the second output unit 25 (see FIG. 6). The remaining part of the bias control current $I_{ec}$ is supplied to the second bias circuit 85 and the third bias circuit 86. In the second operation mode, a constant voltage may be supplied to the one end of the resistor $84_e$ from the second output unit 25.

An emitter of the transistor $84_d$ is connected to the base of the transistor $81_a$ through the resistor $84_f$. That is, the transistor $84_d$ operates as an emitter follower circuit whose emitter serves as an output. Hence, a base potential of the transistor $81_a$ is kept constant.

A circuit configuration of the second bias circuit 85 is the same as that of the first bias circuit 84 except that the second bias circuit 85 does not include the resistor $84_e$. Hence, the portions in which the second bias circuit 85 differs from the first bias circuit 84 will be described, and a description of the portions in which they are the same is omitted.

The bias current $I_{b1b}$, which is a part of the bias current $I_{b1}$, is supplied to one end of the resistor $84_a$ within the second bias circuit 85 from the first output unit 24 (see FIG. 6). A constant voltage may be supplied to the one end of the resistor $84_a$ within the second bias circuit 85 from the first output unit 24.

The bias control current $I_{ecb}$, which is a part of the bias control current $I_{ec}$, is supplied to a collector of the transistor $84_d$ within the second bias circuit 85 from the second output unit 25 (see FIG. 6). The remaining part of the bias control current $I_{ec}$ is supplied to the third bias circuit 86. In the second operation mode, a constant voltage may be supplied to the collector of the transistor $84_d$ within the second bias circuit 85 from the second output unit 25.

A circuit configuration of the third bias circuit 86 is the same as that of the second bias circuit 85. Hence, the portions in which the third bias circuit 86 differs from the second bias circuit 85 will be described, and a description of the portions in which they are the same is omitted.

The bias current $I_{b2}$ is supplied to one end of the resistor $84_a$ within the third bias circuit 86 from the first output unit 24 (see FIG. 6). A constant voltage may be supplied to the one end of the resistor $84_a$ within the third bias circuit 86 from the first output unit 24. The bias control current $I_{ecc}$, which is a part of the bias control current $I_{ec}$, is supplied to a collector of the transistor $84_d$ within the third bias circuit 86 from the second output unit 25 (see FIG. 6). In the second operation mode, a constant voltage may be supplied to the collector of the transistor $84_d$ within the third bias circuit 86 from the second output unit 25.

The high-frequency input signal $RF_{in}$ is inputted to a node $N_1$. The node $N_1$ is connected to the base of the transistor $81_a$ through a first matching network 88 and is connected to the collector of the transistor $81_b$ through an RC series circuit 89. In the embodiment, although the first matching network 88 is an RC series circuit, the first matching network 88 is not limited to this.

The high-frequency input signal $RF_{in}$ passes through the first matching network 88 and is then inputted to the base of the transistor $81_a$. The transistors $81_a$ and $81_b$ output a high-frequency signal $RF_1$ obtained by amplifying the high-frequency input signal $RF_{in}$ from the collector of the transistor $81_b$ to a node $N_2$.

The node $N_2$ is connected to the base of the transistor $82_a$ through a second matching network 90 and is connected to the collector of the transistor $82_a$ through a resistor 91. In the embodiment, although the second matching network 90 is a capacitor, the second matching network 90 is not limited to this.

The high-frequency signal $RF_1$ passes through the second matching network 90 and is then inputted to the base of the transistor $82_a$. The transistor $82_a$ outputs a high-frequency signal $RF_2$ obtained by amplifying the high-frequency signal $RF_1$ from the collector of the transistor $82_a$ to a third matching network 92. In the embodiment, although the third matching network 92 is a capacitor, the third matching network 92 is not limited to this.

The high-frequency signal $RF_2$ passes through the third matching network 92 and is then inputted to the base of the transistor $83_a$. The transistor $83_a$ outputs the high-frequency output signal $RF_{out}$ obtained by amplifying the high-frequency signal $RF_2$ from its collector.

Figure 8:
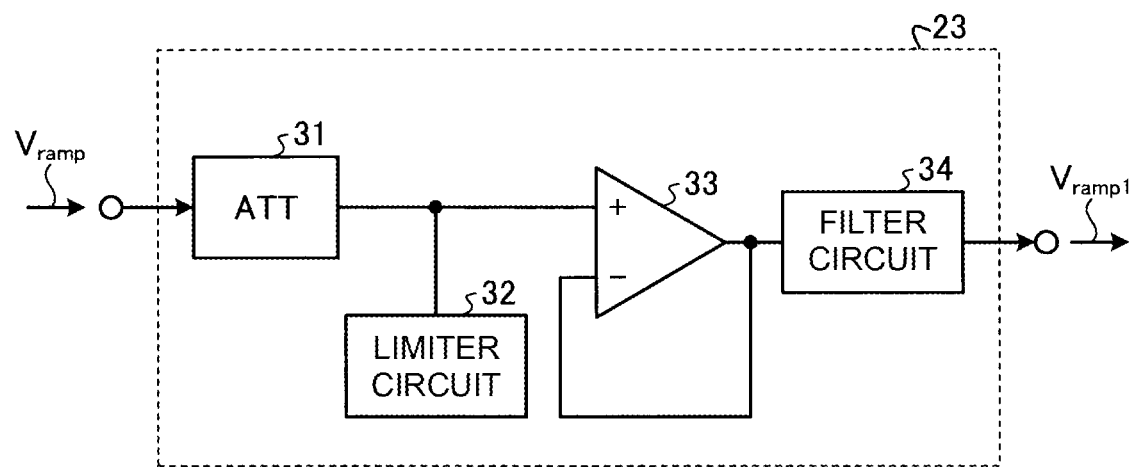
FIG. 8 illustrates a configuration of a level control voltage input unit according to the embodiment.

FIG. 8 illustrates a configuration of a level control voltage input unit according to the embodiment. The level control voltage input unit 23 includes an attenuator circuit 31, a limiter circuit 32, an operational amplifier 33, and a filter circuit 34.

The attenuator circuit 31 attenuates the level control voltage $V_{ramp}$ inputted from the outside to an appropriate level.

When the voltage outputted from the attenuator circuit 31 exceeds a predetermined upper limit, the limiter circuit 32 reduces the voltage outputted from the attenuator circuit 31 to the predetermined upper limit and outputs the voltage to a non-inverting input terminal of the operational amplifier 33. This can inhibit the bias control current $I_{ec}$ from becoming excessive.

An inverting input terminal of the operational amplifier 33 is connected to an output terminal. That is, negative feedback is applied to the operational amplifier 33. The operational amplifier 33 stabilizes the voltage that has passed through the limiter circuit 32 and outputs the voltage to the filter circuit 34.

The filter circuit 34 outputs a level control voltage $V_{ramp1}$ obtained by removing noise from the voltage outputted from the operational amplifier 33 to the second output unit 25.

Figure 9:
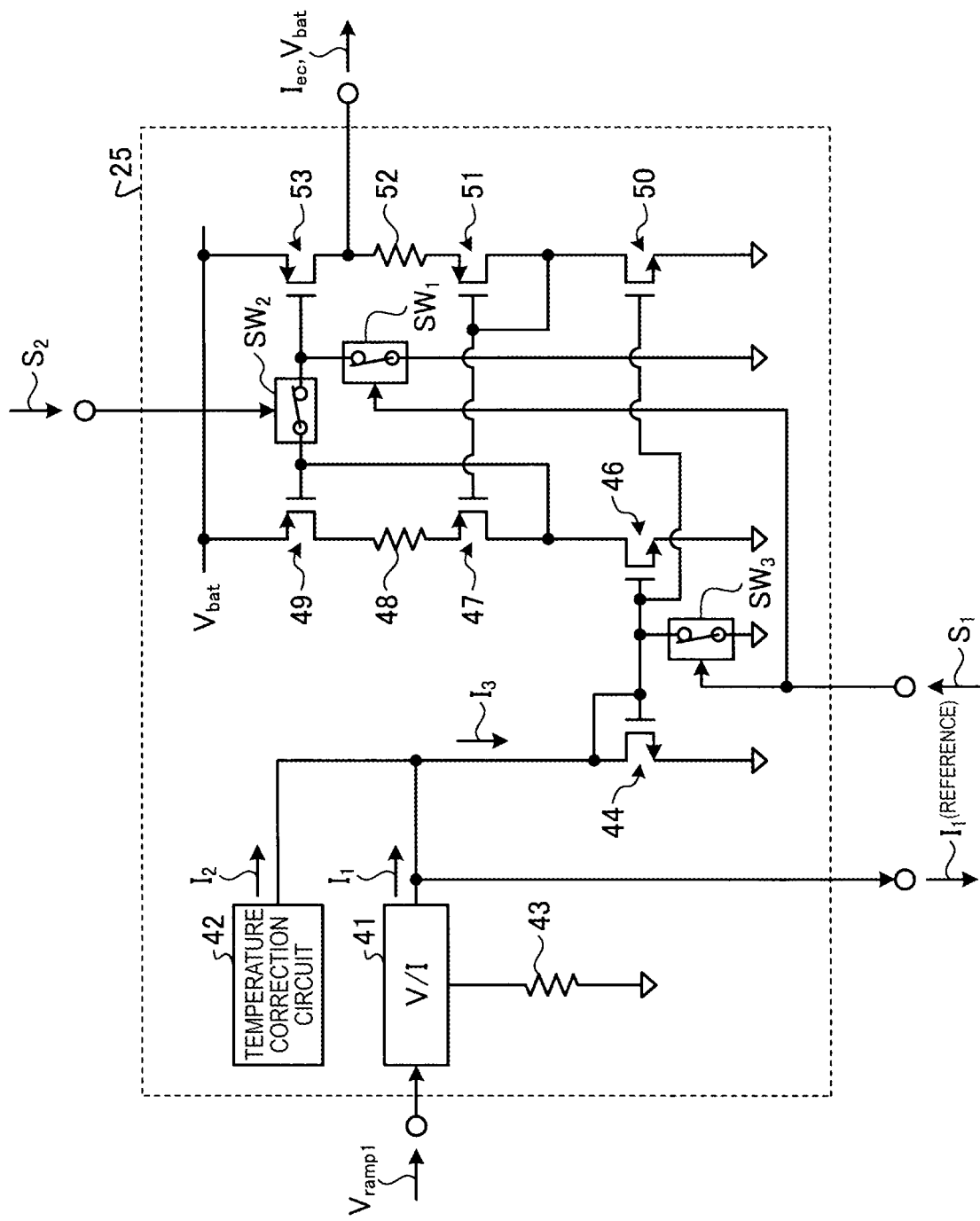
FIG. 9 illustrates a configuration of a second output unit according to the embodiment.

FIG. 9 illustrates a configuration of a second output unit according to the embodiment. The second output unit 25 includes a voltage to current converter circuit 41, a temperature correction circuit 42, resistors 43, 48, and 52, N-channel transistors 44, 46, and 50, switches $SW_1$, $SW_2$, and $SW_3$, and P-channel transistors 47, 49, 51, and 53.

In the embodiment, although each of the switches $SW_1$, $SW_2$, and $SW_3$ is an FET, each switch is not limited to this.

The voltage to current converter circuit 41 is connected to the reference potential through the resistor 43 and converts the level control voltage $V_{ramp1}$ to a current $I_1$. The voltage to current converter circuit 41 outputs the current $I_1$ obtained by the conversion to a drain of the transistor 44.

An output current value of the current $I_1$ of the voltage to current converter circuit 41 is referred to by the third output unit 26 (see FIG. 6). The third output unit 26 outputs the bias current $I_{cas}$ corresponding to the output current value of the voltage to current converter circuit 41 to the first power amplifier circuit 81.

The temperature correction circuit 42 includes a temperature detection element and outputs a current $I_2$ corresponding to a temperature to the drain of the transistor 44.

Thus, a current $I_3$ that flows to the drain of the transistor 44 is the sum of the current $I_1$ corresponding to the level control voltage $V_{ramp1}$ and the current $I_2$ corresponding to the temperature. That is, the equation $I_3=I_1+I_2$ holds.

The transistor 44 is diode connected. A source of the transistor 44 is connected to the reference potential.

Sources of the transistors 46 and 50 are connected to the reference potential. Gates of the transistors 46 and 50 are connected to a gate of the transistor 44. That is, the transistor 44 and the transistors 46 and 50 constitute a current mirror circuit.

The gates of the transistors 46 and 50 are connected to the reference potential through the switch $SW_3$. The switch $SW_3$ is controlled into an on state or off state in accordance with a control signal $S_1$. The control signal $S_1$ is a low-level signal when an operation mode control signal of the digital logic circuit 21 (see FIG. 6) is a first operation mode logic control signal, and is a high-level signal when the operation mode control signal is a second operation mode logic control signal.

That is, in the first operation mode, the switch $SW_3$ is put into an off state, and gate potentials of the transistors 46 and 50 are the same as a gate potential of the transistor 44.

Thus, a current that flows through each of the transistors 46 and 50 is identical to the current $I_3$ that flows through the transistor 44. That is, the current that flows through each of the transistors 46 and 50 is the sum of the current $I_1$ corresponding to the level control voltage $V_{ramp1}$ and the current $I_2$ corresponding to the temperature.

Furthermore, in the second operation mode, the switch $SW_3$ is put into an on state, the gates of the transistors 46 and 50 are connected to the reference potential, and the transistors 46 and 50 are put into an off (interruption) state.

A drain and a gate of the transistor 51, and a gate of the transistor 47 are connected to a drain of the transistor 50. A drain of the transistor 47 is connected to a drain of the transistor 46. That is, the transistor 47 and the transistor 51 constitute a current mirror circuit. Thus, a current that flows through the transistor 51 is identical to a current that flows through the transistor 47.

One end of the resistor 48 is connected to a source of the transistor 47. The other end of the resistor 48 is connected to a drain of the transistor 49.

A source of the transistor 49 is connected to a voltage $V_{bat}$. That is, the transistor 49, the resistor 48, the transistor 47, and the transistor 46 are connected in series between the voltage $V_{bat}$ and the reference potential.

A gate of the transistor 49 is connected to a drain of the transistor 47. Thus, a voltage corresponding to the amount of the voltage drop across the resistor 48 and between the source and the drain of the transistor 47 is applied between the drain and the gate of the transistor 49. That is, the voltage applied between the drain and the gate of the transistor 49 is larger than a voltage applied between the drain and the gate of the transistor 47. Hence, when attention is focused solely on the transistor 49, the transistor 49 can also pass a larger current than the transistor 47. Note that the transistor 49 is connected in series with the transistor 47 and the transistor 46. Thus, a current that flows through the transistor 49 is suppressed by a current that flows through the transistor 47 and the transistor 46. That is, the current that flows through the transistor 49 is suppressed by the sum of the current $I_1$ corresponding to the level control voltage $V_{ramp1}$ and the current $I_2$ corresponding to the temperature.

Furthermore, the voltage drop across the resistor 48 and between the source and the drain of the transistor 47 changes according to a current that flows through the resistor 48 and the transistor 47. That is, the voltage corresponding to the amount of the voltage drop across the resistor 48 and between the source and the drain of the transistor 47 changes according to the sum of the current $I_1$ corresponding to the level control voltage $V_{ramp1}$ and the current $I_2$ corresponding to the temperature. Hence, when attention is focused solely on the transistor 49, a current that can be passed by the transistor 49 changes according to the sum of the current $I_1$ corresponding to the level control voltage $V_{ramp1}$ and the current $I_2$ corresponding to the temperature.

For example, when the sum of the current $I_1$ corresponding to the level control voltage $V_{ramp1}$ and the current $I_2$ corresponding to the temperature increases, the voltage corresponding to the amount of the voltage drop across the resistor 48 and between the source and the drain of the transistor 47 also increases. Hence, the current that can be passed by the transistor 49 also increases.

One end of the resistor 52 is connected to a source of the transistor 51. The other end of the resistor 52 is connected to a drain of the transistor 53.

A source of the transistor 53 is connected to the voltage $V_{bat}$. That is, the transistor 53, the resistor 52, the transistor 51, and the transistor 50 are connected in series between the voltage $V_{bat}$ and the reference potential.

The transistor 53 outputs a current corresponding to a voltage applied to its gate from its drain. Furthermore, the transistor 53 is connected in series with the resistor 52, the transistor 51, and the transistor 50. Thus, a part of the current that flows through the transistor 53 flows through the resistor 52, and the transistors 51 and 50. The current that flows through the resistor 52, and the transistors 51 and 50 is the sum of the current $I_1$ corresponding to the level control voltage $V_{ramp1}$ and the current $I_2$ corresponding to the temperature. The remaining part of the current that flows through the transistor 53 is outputted, as the bias control current $I_{ec}$, to the first bias circuit 84, the second bias circuit 85, and the third bias circuit 86.

The gate of the transistor 53 is connected to the reference potential through the switch $SW_1$. The switch $SW_1$ is controlled into an on state or off state in accordance with the control signal $S_1$. The control signal $S_1$ is a low-level signal when an operation mode control signal of the digital logic circuit 21 (see FIG. 6) is the first operation mode logic control signal, and is a high-level signal when the operation mode control signal is the second operation mode logic control signal.

Furthermore, the gate of the transistor 53 is connected to the gate of the transistor 49 through the switch $SW_2$. The switch $SW_2$ is controlled into an on state or off state in accordance with a control signal $S_2$. The control signal $S_2$ is a high-level signal when an operation mode control signal of the digital logic circuit 21 (see FIG. 6) is the first operation mode logic control signal, and is a low-level signal when the operation mode control signal is the second operation mode logic control signal.

That is, in the first operation mode, the switch $SW_1$ is put into an off state, the switch $SW_2$ is put into an on state, and a gate potential of the transistor 53 is the same as a gate potential of the transistor 49. At this time, the transistor 49 and the transistor 53 constitute a current mirror circuit.

Furthermore, in the second operation mode, the switch $SW_1$ is put into an on state, the switch $SW_2$ is put into an off state, the gate potential of the transistor 53 is the reference potential, and the transistor 53 is put into an on state. Thus, the transistor 53 outputs the voltage $V_{bat}$ to the first bias circuit 84, the second bias circuit 85, and the third bias circuit 86 from its drain.

FIG. 10 illustrates a relationship between an operation mode and a switch in the embodiment.

In the first operation mode, an operation mode control signal within the digital logic circuit 21 is the first operation mode logic control signal. At this time, the control signal $S_1$ is at a low level, and the control signal $S_2$ is at a high level.

Thus, in the first operation mode, the switches $SW_1$ and $SW_3$ are put into an off state, and the switch $SW_2$ is put into an on state. At this time, the current $I_3$ identical to the sum of the current $I_1$ corresponding to the level control voltage $V_{ramp1}$ and the current $I_2$ corresponding to the temperature flows through each of the transistors 46 and 50.

Furthermore, a voltage corresponding to the amount of the voltage drop across the resistor 48 and between the source and the drain of the transistor 47 is applied to the gate of the transistor 53. The transistor 53 outputs a current corresponding to the voltage applied to its gate from its drain. A part of the current that flows through the transistor 53 flows through the resistor 52, the transistor 51, and the transistor 50, and the remaining part of the current that flows through the transistor 53 is outputted, as the bias control current $I_{ec}$, to the first bias circuit 84, the second bias circuit 85, and the third bias circuit 86. Here, the amount of the voltage drop across the resistor 48 and between the source and the drain of the transistor 47 is a voltage corresponding to the sum of the current $I_1$ corresponding to the level control voltage $V_{ramp1}$ and the current $I_2$ corresponding to the temperature. Furthermore, a current that flows through the transistor 51 and transistor 50 is identical to the sum of the current $I_1$ corresponding to the level control voltage $V_{ramp1}$ and the current $I_2$ corresponding to the temperature. Thus, an output of the second output unit 25 can vary according to the sum of the current $I_1$ corresponding to the level control voltage $V_{ramp1}$ and the current $I_2$ corresponding to the temperature, that is, the output of the second output unit 25 is the bias control current $I_{ec}$ that can vary according to the level control voltage $V_{ramp1}$.

In the second operation mode, an operation mode control signal within the digital logic circuit 21 is the second operation mode logic control signal. At this time, the control signal $S_1$ is at a high level, and the control signal $S_2$ is at a low level.

Thus, in the second operation mode, the switches $SW_1$ and $SW_3$ are put into an on state, and the switch $SW_2$ is put into an off state. At this time, each of the transistors 46 and 50 is put into an off state.

Furthermore, the gate of the transistor 53 is connected to the reference potential. Thus, the transistor 53 is put into an on state. Hence, the output of the second output unit 25 is a voltage close to the voltage $V_{bat}$, which is a constant voltage.

Referring back to FIGS. 6 and 7, the case where the level control voltage $V_{ramp}$ is very low in the first operation mode will be described.

The digital logic circuit 21 outputs the first operation mode control signal during the first operation mode, and outputs the second operation mode control signal during the second operation mode.

The switch 27 is put into an on state when the first operation mode control signal is outputted from the digital logic circuit 21, thereby providing continuity between the other end of the resistor 3 and the output terminal of the second output unit 25.

Hence, the switch 27 provides continuity between the other end of the resistor 3 and the output terminal of the second output unit 25 in the first operation mode.

The second output unit 25 outputs, in accordance with the level control voltage $V_{ramp}$, the bias control current $I_{ec}$ that is very small (for example, on the order of about several microamperes (μA)). On the other hand, each of the bias currents $I_{b1}$ and $I_{b2}$ is constant (for example, on the order of about several tens of microamperes).

Thus, when each of the bias currents $I_{b1}$ and $I_{b2}$ is much larger than the bias control current $I_{ec}$, a part of the bias current $I_{b1a}$ flows, as an emitter current, from the emitter of the transistor $84_d$ within the first bias circuit 84 to the first power amplifier circuit 81. At the same time, the remaining part of the bias current $I_{b1a}$ flows, as a shunt current, to the reference potential through a positive-negative (pn) junction between the base and the collector of the transistor $84_d$, and the resistor 3.

Similarly, a part of the bias current $I_{b1b}$ flows, as an emitter current, from the emitter of the transistor $84_d$ within the second bias circuit 85 to the second power amplifier circuit 82. At the same time, the remaining part of the bias current $I_{b1b}$ flows, as a shunt current, to the reference potential through a pn junction between the base and the collector of the transistor $84_d$, and the resistor 3.

Similarly, a part of the bias current $I_{b2}$ flows, as an emitter current, from the emitter of the transistor $84_d$ within the third bias circuit 86 to the third power amplifier circuit 83. At the same time, the remaining part of the bias current $I_{b2}$ flows, as a shunt current, to the reference potential through a pn junction between the base and the collector of the transistor $84_d$, and the resistor 3.

That is, when the control circuit 1 controls the bias control current $I_{ec}$ to a very small value in accordance with the level control voltage $V_{ramp}$ in the first operation mode, the control circuit 1 can make bias currents outputted from the first bias circuit 84, the second bias circuit 85, and the third bias circuit 86 much smaller.

Thus, even when the level control voltage $V_{ramp}$ is very low in the first operation mode, the control circuit 1 can preferably control the gain of the power amplifier 80 in comparison with the first comparative example.

Next, the case of the second operation mode will be described.

The digital logic circuit 21 outputs the first operation mode control signal during the first operation mode, and outputs the second operation mode control signal during the second operation mode.

The switch 27 is put into an off state when the second operation mode control signal is outputted from the digital logic circuit 21, thereby interrupting continuity between the other end of the resistor 3 and the output terminal of the second output unit 25.

Thus, the switch 27 interrupts continuity between the other end of the resistor 3 and the output terminal of the second output unit 25 in the second operation mode. Hence, in the second operation mode, an unnecessary shunt current does not flow through the resistor 3.

As a result, the control circuit 1 can reduce current consumption in the second operation mode in comparison with the second comparative example.

The above-described embodiment is intended to facilitate understanding of the present disclosure, but is not intended for a limited interpretation of the present disclosure. The present disclosure can be changed or improved without departing from the gist thereof and includes equivalents thereof.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A control circuit that controls a power amplifier including one stage or multiple stages of power amplifier circuits and one or multiple bias circuits configured to set electrical bias states of the one stage or the multiple stages of the power amplifier circuits, the control circuit comprising:
   a first output unit configured to output a constant bias current to the one or multiple bias circuits for setting electrical bias states of the one or multiple bias circuits;
   a second output unit configured to output a bias control current or a constant voltage to the one or multiple bias circuits for controlling the electrical bias states of the one or multiple bias circuits;
   a resistor having one end connected to a reference potential; and
   a switch connected between another end of the resistor and an output terminal of the second output unit.

2. The control circuit according to claim 1,
   wherein the second output unit
   has a first operation mode in which the bias control current is varied in accordance with a level control voltage and is output to the one or multiple bias circuits, and a second operation mode in which the constant voltage is output to the one or multiple bias circuits, and
   wherein the switch provides continuity between the other end of the resistor and the output terminal of the second output unit in the first operation mode, and interrupts continuity between the other end of the resistor and the output terminal of the second output unit in the second operation mode.

3. The control circuit according to claim 2,
   wherein in the second operation mode, the bias control current is not varied in accordance with the level control voltage.

4. The control circuit according to claim 1,
   wherein a resistance value of on-resistance of the switch is not greater than 10 percent of a resistance value of the resistor.

5. The control circuit according to claim 1,
   wherein a resistance value of on-resistance of the switch is not greater than 5 percent of a resistance value of the resistor.

6. The control circuit according to claim 1,
   wherein the first output unit, the second output unit, and the switch are provided within a semiconductor integrated circuit, and
   wherein the resistor is provided outside the semiconductor integrated circuit.

7. The control circuit according to claim 1,
   wherein the first output unit, the second output unit, and the switch are provided within a semiconductor integrated circuit, and
   wherein the resistor is provided inside the semiconductor integrated circuit.

8. The control circuit according to claim 1,
   wherein the one or multiple bias circuits comprises a transistor, the constant bias current is supplied to a base of the transistor, and the bias control current or the constant voltage is supplied to a collector of the transistor.

9. The control circuit according to claim 2, wherein: the one or multiple bias circuits comprises a transistor, and in the first operation mode, the bias control current is output to a collector of the transistor.

10. The control circuit according to claim 9, wherein in the second operation mode, a part of the bias control current flows as a shunt current to the reference potential through the resistor and a remaining part of the bias control current flows to the collector of the transistor.

11. The control circuit according to claim 10, wherein in the first operation mode, a current value of the shunt current is constant regardless of a current value of the bias control current.

12. The control circuit according to claim 2, wherein the switch is in an ON state in the first operation mode, and the switch is in an OFF state in the second operation mode.

13. The control circuit according to claim 1, wherein the second output unit is configured to output a plurality of bias control currents to a respective one bias circuit among the multiple bias circuits.

14. The control circuit according to claim 1, wherein at least one of the power amplifier circuits is a cascode connection circuit.

15. The control circuit according to claim 1, wherein at least one of the power amplifier circuits comprises at least two transistors constituting a cascode connection circuit.

16. The control circuit according to claim 2, wherein at least one of the power amplifier circuits comprises at least two transistors constituting a cascode connection circuit.

17. The control circuit according to claim 16, wherein an emitter of one of the at least two transistors is connected to the reference potential.

18. The control circuit according to claim 16, wherein a collector and a base of one of the at least two transistors are connected to each other.

19. The control circuit according to claim 2,
   wherein a resistance value of on-resistance of the switch is not greater than 10 percent of a resistance value of the resistor.

20. The control circuit according to claim 2,
   wherein the first output unit, the second output unit, and the switch are provided within a semiconductor integrated circuit, and
   wherein the resistor is provided outside the semiconductor integrated circuit.

* * * * *